US012735605B2

(12) United States Patent
Park et al.

(10) Patent No.: US 12,735,605 B2
(45) Date of Patent: Sep. 15, 2026

(54) POLISHING COMPOSITION FOR SEMICONDUCTOR PROCESSING, METHOD FOR PREPARING POLISHING COMPOSITION, AND METHOD FOR MANUFACTURING SEMICONDUCTOR ELEMENT TO WHICH POLISHING COMPOSITION IS APPLIED

(71) Applicant: SK enpulse Co., Ltd., Gyeonggi-do (KR)

(72) Inventors: Han Teo Park, Seoul (KR); Deok Su Han, Seoul (KR); Jang Kuk Kwon, Seoul (KR); Seung Chul Hong, Seoul (KR)

(73) Assignee: YCCHEM CO., LTD., Gyeongsangbuk-do (KR)

( * ) Notice: Subject to any disclaimer, the term of this patent is extended or adjusted under 35 U.S.C. 154(b) by 482 days.

(21) Appl. No.: 18/255,600

(22) PCT Filed: Oct. 18, 2021

(86) PCT No.: PCT/KR2021/014480
§ 371 (c)(1),
(2) Date: Jun. 2, 2023

(87) PCT Pub. No.: WO2022/124559
PCT Pub. Date: Jun. 16, 2022

(65) Prior Publication Data

US 2024/0043718 A1 Feb. 8, 2024

(30) Foreign Application Priority Data

Dec. 9, 2020 (KR) ........................ 10-2020-0170997
Oct. 18, 2021 (KR) ........................ 10-2021-0138195

(51) Int. Cl.
*C09G 1/02* (2006.01)
*H10P 52/40* (2026.01)

(52) U.S. Cl.
CPC .............. *C09G 1/02* (2013.01); *H10P 52/402* (2026.01)

(58) Field of Classification Search
None
See application file for complete search history.

(56) References Cited

U.S. PATENT DOCUMENTS

2002/0098697 A1 7/2002 Shimazu et al.
2006/0243702 A1* 11/2006 Minamihaba ....... H01L 21/3212 438/692

(Continued)

FOREIGN PATENT DOCUMENTS

CN 106867411 A 6/2017
CN 111732898 A 10/2020

(Continued)

OTHER PUBLICATIONS

Machine Translation of KR-10-2020-0057566 A; (Year: 2020).*

(Continued)

*Primary Examiner* — Shamim Ahmed
(74) *Attorney, Agent, or Firm* — IP & T GROUP LLP

(57) ABSTRACT

The present invention relates to a polishing composition for a semiconductor process, a method of preparing the polishing composition, and a method of fabricating a semiconductor device using the polishing composition. The polishing composition for a semiconductor process may be applied to a process of polishing an amorphous carbon layer, may exhibit a high removal rate of the amorphous carbon layer, may prevent the occurrence of defects by preventing carbon residue from being re-adsorbed onto a semiconductor substrate during the polishing process, and has excellent storage (Continued)

stability. The present invention may also provide a method of fabricating a semiconductor device using the polishing composition for a semiconductor process.

7 Claims, 1 Drawing Sheet

(56) References Cited

U.S. PATENT DOCUMENTS

| | | | | |
|---|---|---|---|---|
| 2016/0137880 | A1 | 5/2016 | Kim et al. | |
| 2022/0089908 | A1* | 3/2022 | Reiss | H01L 21/31053 |

FOREIGN PATENT DOCUMENTS

| | | | |
|---|---|---|---|
| KR | 10-0643628 | B1 | 11/2006 |
| KR | 10-2018-0064018 | A | 6/2018 |
| KR | 20180064018 | A | 6/2018 |
| KR | 10-2019-0053739 | A | 5/2019 |
| KR | 10-2020-0057566 | A | 5/2020 |
| KR | 20200057566 | A | 5/2020 |
| KR | 10-2020-0062732 | A | 6/2020 |

OTHER PUBLICATIONS

Machine Translation of KR-10-2018 A; (Year: 2018).*

Office Action on the Korean Patent Application No. 10-2021-0138360 issued by the Korean Patent Office on Oct. 19, 2023.

International Search Report for International Application No. PCT/KR2021/014480 issued by the International Searching Authority on Jan. 24, 2022.

Written Opinion for International Application No. PCT/KR2021/014480 issued by the International Searching Authority on Jan. 24, 2022.

Office Action on the Korean Patent Application No. 10-2021-0138195 issued by the Korean Patent Office on Oct. 19, 2023.

Office Action for Chinese Patent Application No. 202180082951.6 issued by the Chinese Patent Office on Jun. 18, 2025.

* cited by examiner

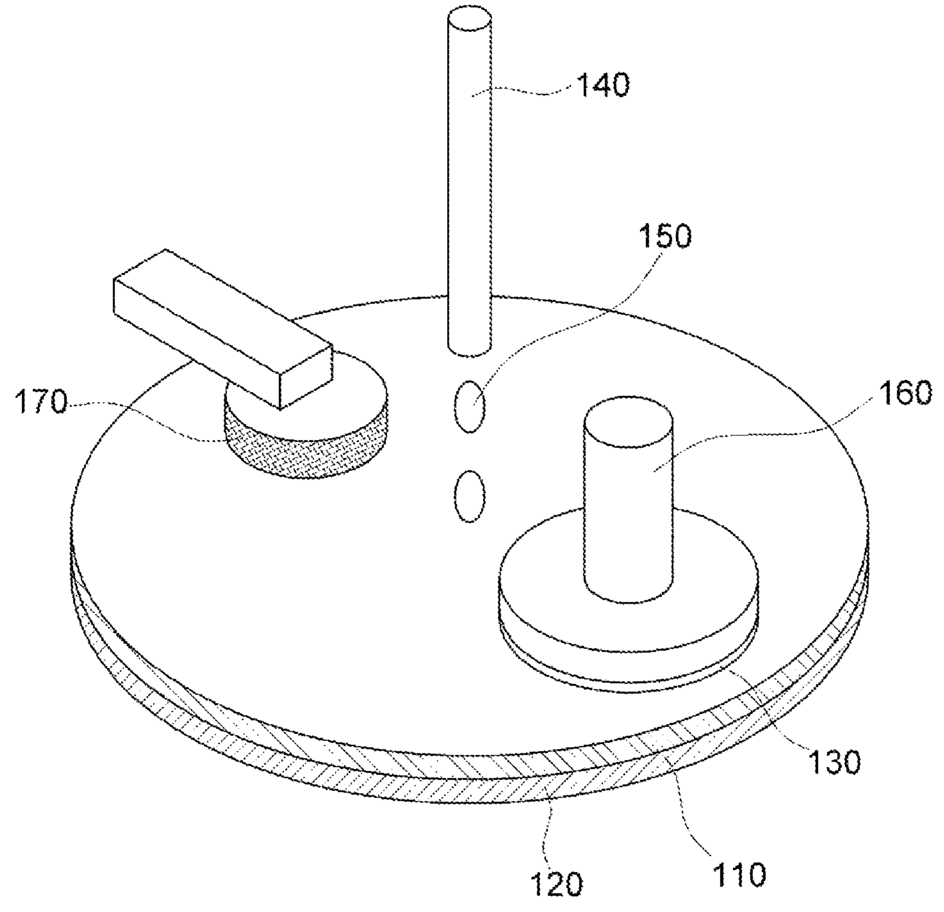
140
150
170
160
130
120
110

POLISHING COMPOSITION FOR SEMICONDUCTOR PROCESSING, METHOD FOR PREPARING POLISHING COMPOSITION, AND METHOD FOR MANUFACTURING SEMICONDUCTOR ELEMENT TO WHICH POLISHING COMPOSITION IS APPLIED

TECHNICAL FIELD

The present invention relates to a polishing composition for a semiconductor process, a method of preparing the polishing composition, and a method of fabricating a semiconductor device using the polishing composition.

BACKGROUND ART

As semiconductor devices have become finer and denser, techniques for forming finer patterns have been used, and accordingly, surface structures of semiconductor devices have become more complex and the step difference between interlayer dielectric layers have also increased. In fabrication of a semiconductor device, a chemical mechanical polishing (hereinafter referred to as “CMP”) process is used as a planarization technique for removing a stepped portion from a specific layer formed on a substrate.

In the CMP process, a surface of a substrate is polished while a slurry is provided to a polishing pad and the substrate is pressed and rotated. A target to be planarized varies depending on a step of the process, and there is also a difference in physical properties of the slurry applied at this time.

Specifically, the CMP process has been applied to the planarization of dielectric layers such as silicon oxide ($SiO_2$) and silicon nitride (SiN), and is also essentially used in planarization processes for metal wiring layers such as tungsten (W) and copper (Cu).

As semiconductor devices have become highly integrated, formation of finer patterns and multi-layered circuits has been required.

To this end, layers of various materials having different etch selectivity characteristics are required. Among these layers of various materials, carbon-based organic layers have good etch selectivity with respect to other silicon-containing layers, and thus may be used as mask layers or sacrificial layers.

In a semiconductor fabrication process, it is required to remove an organic layer by performing a chemical mechanical polishing process on the organic layer. However, a polishing composition capable of efficiently polishing an organic layer, which is applied in a semiconductor fabrication process, by applying the CMP process to the organic layer, has not been developed.

It is necessary to develop a polishing composition for a semiconductor process that is capable of solving the above-described problems.

DISCLOSURE

Technical Problem

An object of the present invention is to provide a polishing composition for a semiconductor process, a method for preparing the polishing composition, and a method of fabricating a semiconductor device using the polishing composition.

Another object of the present invention is to provide a polishing composition for a semiconductor process, which may be applied to a process of polishing an amorphous carbon layer (ACL), may exhibit a high removal rate of the ACL, and prevents the occurrence of defects by preventing carbon residue from being adsorbed onto a semiconductor substrate during the polishing process.

Still another object of the present invention is to provide a method for preparing a polishing composition for a semiconductor process, in which the polishing composition maintains its polishing performance at high temperatures and has high storage stability, through stabilization of an accelerator in the polishing composition.

Yet another object of the present invention is to provide a method of fabricating a semiconductor device using a polishing composition for a semiconductor process.

Technical Solution

To achieve the above objects, a polishing composition for a semiconductor process according to one embodiment of the present invention may contain abrasive particles, an accelerator, and a stabilizer.

A method for preparing a polishing composition for a semiconductor process according to another embodiment of the present invention may include steps of: a) preparing a polishing solution by mixing a stabilizer and an accelerator in a solvent; b) adjusting the pH of the polishing solution to 2 to 5 by adding a pH adjusting agent to the polishing solution; and c) mixing a surfactant and abrasive particles with the polishing solution having a pH of 2 to 5.

A method of fabricating a semiconductor device according to still another embodiment of the present invention may include steps of: 1) providing a polishing pad including a polishing layer; 2) supplying a polishing composition for a semiconductor process to the polishing pad; and 3) polishing a polishing target while allowing the polishing target and the polishing pad to rotate relative to each other so that the polishing-target surface of the polishing target comes into contact with the polishing surface of the polishing layer, wherein the polishing surface may be an amorphous carbon layer, and the polishing composition may contain abrasive particles, an accelerator, and a stabilizer.

Advantageous Effects

The polishing composition for a semiconductor process may be applied to a process of polishing an amorphous carbon layer (ACL), may exhibit a high removal rate of the ACL, prevents the occurrence of defects by preventing carbon residue from being adsorbed onto a semiconductor substrate during the polishing process, maintains its polishing performance at high temperatures, and has excellent storage stability.

The present invention may also provide a method of fabricating a semiconductor device using the polishing composition for a semiconductor process

BRIEF DESCRIPTION OF DRAWINGS

FIG. 1 is a schematic view showing a process for fabricating a semiconductor device according to one embodiment of the present invention.

BEST MODE

The present invention is directed to a polishing composition for a semiconductor process containing abrasive particles, an accelerator, and a stabilizer.

Mode for Invention

Hereinafter, embodiments of the present invention will be described in detail so that those skilled in the art can easily carry out the present invention. However, the present invention may be embodied in a variety of different forms and is not limited to the embodiments described herein.

In the present specification, it is to be understood that when any component is referred to as "including" or "containing" another component, it may further include other components, rather than excluding other components, unless otherwise specified.

In the present specification, when any component is referred to as being "connected to" another component, it not only refers to a case where any component is "connected directly to" another component, but also a case where any component is "connected to another component with a third component interposed therebetween".

In the present specification, the expression "B is located on A" means that B is located directly on A or B is located on A while another layer is located therebetween, and the expression is not construed as being limited to "B is located in contact with the surface of A".

As used herein, the term "combination thereof" included in any Markush-type expression refers to a mixture or combination of one or more selected from the group consisting of the components described in the Markush-type expression, and is meant to include one or more selected from the group consisting of the above components.

As used herein, the expression "A and/or B" refers to "A", "B", or "A and B".

As used herein, terms such as "first" and "second" or "A" and "B" are used to distinguish the same terms from each other, unless otherwise specified.

In the present specification, singular expressions are intended to include plural expressions as well, unless specified otherwise in the context thereof.

Hereinafter, the present invention will be described in more detail.

As semiconductor devices have become finer and denser, surface structures thereof have become more complex. The complexity of the surface structure means that the line width of the semiconductor device is narrowed. The aspect ratio (horizontal-to-vertical ratio) is also gradually increasing, and photoresist is gradually becoming thinner due to the increasing aspect ratio.

However, a phenomenon occurs in which elongate photoresist structures collapse without withstanding the etching process, and a hard mask process has been introduced to prevent this phenomenon.

As the hard mask materials, amorphous carbon and SiON have been used.

The amorphous carbon has excellent etching resistance when used as a hard mask. Nevertheless, when the amorphous carbon is subjected to a chemical mechanical polishing process using a conventional polishing composition, a problem arises in that the removal rate of the amorphous carbon is low and carbon residue is adsorbed onto the surface of the semiconductor substrate due to the generation of carbon residue, causing defects on the semiconductor substrate.

Accordingly, the polishing composition for a semiconductor process of the present invention may not only exhibit a high removal rate of an amorphous carbon layer, but also prevent re-adsorption of carbon residue, thereby preventing the occurrence of defects on a semiconductor substrate.

Specifically, a polishing composition that is supplied to a process of polishing an amorphous carbon layer (ACL) may contain abrasive particles, an accelerator, and a stabilizer.

The accelerator and the stabilizer may be contained at a weight ratio of 0.5:1 to 3:1.

As described above, the conventional polishing composition used for a polishing process for an amorphous carbon layer has a problem in that it exhibits a low removal rate, and thus the efficiency of the polishing process is low.

In order to overcome this problem, an accelerator was contained in a conventional polishing composition, thus increasing the removal rate of the amorphous carbon layer. However, as the accelerator was contained, apart from the removal rate in the process of polishing the amorphous carbon layer, not only the number of defects increased due to the adsorption of carbon residue onto the semiconductor substrate, but also contamination of the polishing pad occurred.

In addition, when the polishing process was performed at 60° C. or higher, a problem arose in that the removal was lowered. Even when the conventional polishing composition was applied to the polishing process after long-term storage, a problem arose in that the removal rate was lowered, indicating that the polishing composition had poor stability.

Accordingly, the present invention may provide a polishing composition that may increase the removal rate of an amorphous carbon layer, prevent contamination of a polishing pad, prevent degradation of polishing performance at high temperatures, and has excellent long-term storage stability.

Specifically, the polishing composition of the present invention contains abrasive particles, an accelerator, and a stabilizer. As the polishing composition contains both the accelerator and the stabilizer, the polishing rate of the amorphous carbon layer may be increased by the accelerator, and the stability of the polishing composition may be increased by the stabilizer.

Specifically, the accelerator and stabilizer may be contained at a weight ratio of 0.5:1 to 3:1, 0.5:1 to 2:1, or 0.55:1 to 1.9:1. When the accelerator and stabilizer are mixed within the above range and used, the polishing composition may exhibit a high removal rate of the amorphous carbon layer, and carbon residue may also be prevented from being adsorbed onto a semiconductor substrate during the polishing process. In addition, it is possible to prevent lowering of the removal rate even in the polishing process that is performed at 60° C. or higher, and it is possible to prevent lowering of the removal rate even when the polishing composition is stored for a long period of time.

The accelerator may be selected from the group consisting of anionic small molecules, anionic polymers, hydroxyl acids, amino acids, and cerium salts. Specifically, the cerium salt may be a trivalent cerium salt or a tetravalent cerium salt. More specifically, the tetravalent cerium salt may be selected from the group consisting of cerium (IV) sulfate ($Ce(SO_4)_2$), ammonium cerium sulfate dihydrate, and cerium ammonium nitrate, without being limited to the above examples.

The accelerator contained in the polishing composition may oxidize the surface layer of the amorphous carbon layer into oxides or ions, thereby facilitating removal of the surface layer of the amorphous carbon layer. In addition, there is an advantage in that the accelerator allows organic layer material residue present in a polishing stop layer to be easily removed, thereby enabling more uniform polishing.

The cerium ammonium nitrate may be present in the slurry composition in the form of an ionic compound or a chelate compound, and when the cerium ammonium nitrite is used in this form, it may provide a high removal rate of an amorphous carbon layer.

The stabilizer serves to increase the stability of the polishing composition and prevent the occurrence of defects in a polishing process, and the stabilizer may be an amino acid. More specifically, the amino acid may be selected from the group consisting of arginine, histidine, lysine, aspartic acid, glutamic acid, glutamine, cysteine, proline, asparagine, threonine, alanine, glycine, valine, leucine, isoleucine, and mixtures thereof, and preferably, may be alanine, without being limited to the above examples, and it is possible to use any amino acid, which may be used in combination with the accelerator to increase the stability of the polishing composition and suppress the occurrence of defects during a polishing process, without limitation.

More specifically, the polishing composition for a semiconductor process may have a polishing performance reduction rate (PPR) of 0% to 60% as calculated by Equation 1 below:

$$PPR = \frac{A0 - A1}{AO} \times 100 \quad \text{[Equation 1]}$$

wherein

A0 is a removal rate measured after performing a polishing process on an amorphous carbon layer (ACL) having a thickness of 2,000 Å for 60 seconds using the polishing composition under the following polishing conditions: a polishing pressure of 2 psi, a carrier rotation speed of 87 rpm, a platen rotation speed of 93 rpm, and a feed flow rate of the polishing composition of 200 ml/min; and A1 is a removal rate measured after performing the polishing process on the ACL for 60 seconds using the polishing composition under the above polishing conditions after keeping the polishing composition at a temperature of 60° C. for 40 hours and cooling the polishing composition at 20 to 25° C.

In many cases, the polishing composition for a semiconductor process is used in an actual polishing process after it is stored for a considerable time before introduction into an actual polishing process after preparation thereof. For this reason, the polishing composition must have excellent storage stability. That is, the polishing composition is not used in a polishing process immediately after preparation thereof, and several days may be consumed for a transport transfer process and a storage process before introduction into an actual polishing process. When the polishing composition prepared as described above is stored for a considerable period of time, a problem may arise in that agglomeration of the abrasive particles in the polishing composition occurs or the polishing performance of the polishing composition decreases due to a change in the components. This problem is considered to be related to whether or not long-term storage stability is ensured.

In order to evaluate the stability, it is necessary to examine the degree of changes in the polishing performance after long-term storage.

In order to evaluate the stability, in the present invention, the polishing composition was placed at a high temperature of 60° C. and kept at that temperature for 40 hours, and the degree of degradation of the polishing performance was examined.

Keeping the polishing composition at 60° C. is to evaluate the stability under stress conditions, and keeping the polishing composition at 60° C. for 1 hour is similar to storing the polishing composition for about 1 day at 15 to 25° C., which is a room temperature condition. Thus, keeping the polishing composition at 60° C. for 40 hours as described above means the polishing composition after about 40 days of storage.

The polishing composition of the present invention exhibits a polishing performance reduction rate (PPR) of 0% to 60%, or 0% to 30%, or 0% to 10%, or 0% to 5%, even after being left at 60° C., which is a stress condition, for 40 hours, and exhibiting a polishing performance reduction rate within the above range means that the polishing composition exhibits excellent long-term storage stability.

The abrasive particles are abrasive particles applicable to a polishing composition for a semiconductor process, and may be selected from the group consisting of, for example, metal oxide particles, organic particles, organic-inorganic composite particles, and mixtures thereof.

Specifically, the metal oxide particles may be selected from the group consisting of colloidal silica, fumed silica, ceria, alumina, titania, zirconia, zeolite particles, and mixtures thereof, without being limited to the above examples, and any abrasive particles selectable by a person skilled in the art may be used without limitation.

Examples of the organic particles include polystyrene, styrene-based copolymer, poly(meth)acrylate, (meth)acrylate-based copolymer, polyvinyl chloride, polyamide, polycarbonate, or polyimide polymer particles, or core/shell structured particles in which the polymer constitutes a core, a shell, or both, and these particles may be used alone or in combination. The organic particles may be produced by emulsion polymerization, suspension polymerization, or the like.

Specifically, the abrasive particles of the present invention may be selected from the group consisting of colloidal silica, fumed silica, ceria particles, and mixtures thereof.

The abrasive particles may have a diameter (D50) of 10 to 120 nm, preferably a diameter (D50) of 20 to 100 nm, more preferably a diameter (D50) of 20 to 80 nm. If the metal oxide particles have a diameter of more than 120 nm, the possibility of causing defects such as scratches on a polishing-target substrate may increase, and if the diameter is less than 20 nm, the dispersibility of the particles may be poor.

The polishing composition may further contain a surfactant and a pH adjusting agent.

If the polishing composition contains an accelerator to increase the removal rate of an amorphous carbon layer, the removal rate increases, but problems arise in that carbon residue generated during the polishing process is adsorbed onto the semiconductor substrate and in that contamination of the polishing pad occurs.

In order to solve the above problem, a surfactant is contained in the polishing composition to reduce the surface tension of the polishing composition. As the surface tension is reduced, re-adsorption of carbon residue to the substrate surface may be prevented, and contamination of the polishing pad may be prevented.

Specifically, the surfactant may include a nonionic fluorine-based polymer compound. The surfactant includes a fluorine-based polymer compound, and when it is used in a polishing process for an amorphous carbon layer, it may prevent generated carbon residue from being re-adsorbed to the surface of the semiconductor substrate.

In addition, since the surfactant contains fluorine, it may suppress the multiplication of microorganisms such as bacteria and fungi. If a polishing composition is stored for a long period of time, bacteria and fungi may occur, and the polishing composition in which bacteria and fungi have occurred cannot be used in the polishing process and must be discarded.

In the polishing composition of the present invention, the surfactant includes a nonionic fluorine-based polymer compound, and when the polishing composition is stored for a long period of time, the nonionic fluorine-based polymer compound may prevent the occurrence of bacteria and fungi, thereby increasing the long-term storage stability of the polishing composition.

The surfactant of the present invention may be specifically selected from the group consisting of Chemours™ FS-30, FS-31, FS-34, ET-3015, ET-3150, ET-3050, and mixtures thereof, but any surfactant serving to prevent carbon residue generated in the polishing process from being re-adsorbed to the surface of a semiconductor substrate may be used without particular limitation.

The surfactant of the present invention may be a nonionic surfactant, and a surfactant including a nonionic fluorine-based polymer compound may be used alone or in combination with other nonionic surfactants.

The nonionic surfactant may be selected from the group consisting of polyethylene glycol, polypropylene glycol, a polyethylene-propylene copolymer, polyalkyl oxide, polyoxyethylene oxide (PEO), polyethylene oxide, and polypropylene oxide, and the fluorine-based surfactant may be selected from the group consisting of a sodium sulfonate fluorosurfactant, a phosphate ester fluorosurfactant, an amine oxide fluorosurfactant, a betaine fluorosurfactant, an ammonium carboxylate fluorosurfactant, a stearate ester fluorosurfactant, a quaternary ammonium fluorosurfactant, an ethylene oxide/propylene oxide fluorosurfactant, and a polyoxyethylene fluorosurfactant.

The pH adjusting agent may be at least one selected from the group consisting of hydrochloric acid, phosphoric acid, sulfuric acid, hydrofluoric acid, nitric acid, hydrobromic acid, iodic acid, formic acid, malonic acid, maleic acid, oxalic acid, acetic acid, adipic acid, citric acid, acetic acid, propionic acid, fumaric acid, lactic acid, salicylic acid, pimelic acid, benzoic acid, succinic acid, phthalic acid, butyric acid, glutaric acid, glutamic acid, glycolic acid, lactic acid, aspartic acid, tartaric acid, and potassium hydroxide.

The pH adjusting agent may adjust the pH of the polishing composition for a semiconductor process to 2 to 5, preferably 2 to 4. When the polishing composition is kept at an acidic pH within the above range, it is possible to maintain the removal rate and the quality of the polishing composition at certain levels or higher while preventing excessive corrosion of metal components or a polishing device.

The polishing composition for a semiconductor process may contain 0.1 wt % to 0.5 wt % of the abrasive particles, 1 wt % to 2 wt % of the accelerator, 1 wt % to 2 wt % of the stabilizer, 0.001 wt % to 0.01 wt % of the surfactant, and the balance of a solvent. When the above components are contained in the polishing composition in amounts within the above ranges, the accelerator may be stabilized by the stabilizer, and thus the removal rate may be increased by the accelerator in the polishing composition, and the occurrence of defects in a polishing process may be prevented by the stabilizer and the surfactant.

The solvent may ultrapure water, but is not limited to the above example, and any solvent may be used without limitation as long as it may be a solvent for the polishing composition.

If the surfactant is contained in an amount smaller than the lower limit of the above range, a problem arises in that the occurrence of surface defects on a semiconductor substrate in a polishing process increases, and if the surfactant is contained in an amount larger than the upper limit of the above range, a problem arises in that a large amount of bubbles are generated during the preparation of the polishing composition.

The polishing composition may be supplied to a process of polishing an amorphous carbon layer (ACL), and the removal rate of the amorphous carbon layer may be 190 Å/min or more. When the polishing rate of the amorphous carbon layer is 190 Å/min or more as described above, it can be said that the polishing efficiency for the amorphous carbon layer is excellent.

Even when the weight ratio between the accelerator and the stabilizer in the polishing composition described above is included within the scope of the present invention, if the accelerator is contained in an amount smaller than the content of the accelerator relative to the abrasive particles, a problem may arise in that the removal rate is low due to a low content of the accelerator. Therefore, in order to exhibit a high removal rate of an amorphous carbon layer, prevent the occurrence of defects in a polishing process, prevent contamination of a polishing pad, and increase the stability of a polishing composition, as does the polishing composition of the present invention, it is required not only to satisfy the range of the weight ratio between the accelerator and the stabilizer, but also to satisfy all of the above-described content ranges of the components in the polishing composition of the present invention.

A method for preparing a polishing composition according to the present invention may include steps of: a) preparing a polishing solution by mixing a stabilizer and an accelerator in a solvent; b) adjusting the pH of the polishing solution to 2 to 5 by adding a pH adjusting agent to the polishing solution; and c) mixing a surfactant and abrasive particles with the polishing solution having a pH of 2 to 5.

In step a), a stabilizer may be mixed with a solvent in order to stabilize an accelerator, thereby preparing a first solution, and then the accelerator may be mixed with the first solution, thereby preparing a polishing solution.

If a polishing composition is prepared by mixing the accelerator with a stabilizer, a pH adjusting agent, a surfactant and abrasive particles in ultrapure water as a solvent, the accelerator may not be stabilized in the polishing composition, making it difficult to store the prepared polishing composition for a long time, or the effect of increasing the removal rate by the accelerator in the polishing composition may not appear.

To prevent this problem, a first solution is prepared by mixing a stabilizer with a solvent, a polishing solution is prepared by dissolving an accelerator in the first solution, and then a polishing composition is prepared by a subsequent step.

A method of fabricating a semiconductor device according to still another embodiment of the present invention may include steps of: 1) providing a polishing pad including a polishing layer; 2) supplying a polishing composition for a semiconductor process to the polishing pad; and 3) polishing a polishing target while allowing the polishing target and the polishing pad to rotate relative to each other so that the polishing-target surface of the polishing target comes into contact with the polishing surface of the polishing layer, wherein the polishing surface may be an amorphous carbon layer, the polishing composition may contain abrasive particles, an accelerator, and a stabilizer, and the accelerator and the stabilizer may be contained at a weight ratio of 0.5:1 to 2:1.

FIG. 1 is a schematic view showing a process for fabricating a semiconductor device according to one embodiment of the present invention. Referring to FIG. 1, according to the embodiment, a polishing pad 110 is mounted on a platen 120, and then a semiconductor substrate 130 as a polishing target is disposed on the polishing pad 110. For polishing, a polishing slurry 150 is sprayed onto the polishing pad 110 through a nozzle 140.

The flow rate of the polishing slurry 150 that is supplied through the nozzle 140 may be selected within the range of about 10 $cm^3$/min to about 1,000 $cm^3$/min depending on the purpose, and may be, for example, about 50 $cm^3$/min to about 500 $cm^3$/min, without being limited thereto.

Here, the polishing-target surface of the semiconductor substrate 130 is in direct contact with the polishing surface of the polishing pad 110.

Next, the semiconductor substrate 130 and the polishing pad 110 may be rotated relative to each other, so that the surface of the semiconductor substrate 130 may be polished. In this case, the rotating direction of the semiconductor substrate 130 and the rotating direction of the polishing pad 110 may be the same direction or may be opposite to each other. The rotating speed of each of the semiconductor substrate 130 and the polishing pad 110 may be selected within the range of about 10 rpm to about 500 rpm depending on the purpose, and may be, for example, about 30 rpm to about 200 rpm, without being limited thereto.

In an example of the substrate polishing process, an organic layer on a substrate may be polished, and the present invention may be applied to a process of polishing a carbon-based organic layer.

Specifically, the carbon-based organic layer may be, for example, a C-SOH (spin-on-hardmask) layer, an amorphous carbon layer, or an NCP layer, and is preferably an amorphous carbon layer for which the polishing composition may have an excellent selective polishing effect and exhibit a high removal rate.

Contents regarding the polishing composition for a semiconductor process overlap with those described above, and thus detailed description thereof will be omitted.

In one embodiment, the method of fabricating a semiconductor device may further include a step of processing the polishing surface of the polishing pad 110 by a conditioner 170 at the same time as polishing of the semiconductor substrate 130 in order to maintain the polishing surface of the polishing pad 110 in a state suitable for polishing.

PREPARATION OF COMPOSITION FOR SEMICONDUCTOR POLISHING

Example 1

A mixed solution was prepared by mixing ultrapure water with alanine as a stabilizer, and a polishing solution was prepared by mixing cerium ammonium nitrite with the mixed solution.

The pH of the polishing composition was adjusted to 2.1 by adding nitric acid to the polishing solution, and the polishing solution was mixed with Chemours™ FS-30 as a surfactant and colloidal silica having a diameter of 75 nm, thereby preparing a polishing composition.

The weight ratios between the accelerator and the stabilizers in the Examples and Comparative Examples are shown in Table 1 below.

TABLE 1

| | Abrasive particles | Accelerators (ACC) | Stabilizer (STA) | Surfactant | ACC:STA |
|---|---|---|---|---|---|
| Example 1 | 0.25 | 1.3 | 1.19 | 0.005 | 1.09:1 |
| Example 2 | 0.25 | 2 | 1.92 | 0.005 | 1.04:1 |
| Example 3 | 0.25 | 1.3 | 2.22 | 0.005 | 0.59:1 |
| Example 4 | 0.25 | 2.23 | 1.19 | 0.005 | 1.87:1 |
| Example 5 | 0.25 | 0.6 | 0.46 | 0.005 | 1.3:1 |
| Comparative Example 1 | 0.25 | 1.3 | 0.16 | 0.005 | 8.13:1 |
| Comparative Example 2 | 0.25 | 0.6 | 1.92 | 0.005 | 0.31:1 |
| Comparative Example 3 | 0.25 | 1.55 | 0.46 | 0.005 | 3.37:1 |

(unit: wt %; the remainder is ultrapure water)

Experimental Example

Removal Rate and Whether Defects on Semiconductor Substrate Surface Occur

In order to examine the removal rate and whether surface defects on a semiconductor substrate occur when the polishing composition of the present invention is applied to a polishing process, the present inventors performed the polishing process using the polishing composition, measured the removal rate, and examined whether surface defects occurred.

Specifically, the polishing process was performed on an amorphous carbon layer (ACL) having a thickness of 2,000 Å for 60 seconds under the following polishing conditions: a polishing pressure of 2 psi, a carrier rotation speed of 87 rpm, a platen rotation speed of 93 rpm, and a feed flow rate of the polishing composition of 200 ml/min.

The removal rate of the amorphous carbon layer under the above polishing conditions was measured (A0), and whether defects occurred was examined using KLA Tencor AIT-XP+.

In addition, the polishing composition of each of the Examples and the Comparative Examples was placed and kept in an oven heated to 60° C. for 40 hours, and then cooled at 20 to 25° C., and then the polishing process was performed on an amorphous carbon layer using the polishing composition under the same conditions as described above, and the removal rate of the amorphous carbon layer was measured (A1).

Using the measured removal rates, the polishing performance reduction rate (PPR) was calculated by Equation 1 below:

$$PPR = \frac{A0 - A1}{AO} \times 100 \qquad \text{[Equation 1]}$$

wherein

A0 is a removal rate measured after performing a polishing process on an amorphous carbon layer (ACL) having a thickness of 2,000 Å for 60 seconds using the polishing composition under the following conditions: a polishing pressure of 2 psi, a carrier rotation speed of 87 rpm, a platen rotation speed of 93 rpm, and a feed flow rate of the polishing composition of 200 ml/min; and A1 is a removal rate measured after performing the polishing process on the ACL for 60 seconds using the polishing composition under the above polishing conditions after keeping the polishing composition at a temperature of 60° C. for 40 hours and cooling the polishing composition at 20 to 25° C.

TABLE 2

| | A0 (Å/min) | A1 (Å/min) | PPR (%) | Defect (ea) |
|---|---|---|---|---|
| Example 1 | 203 | 199 | 2 | 11089 |
| Example 2 | 266 | 261 | 2 | 12274 |
| Example 3 | 194 | 194 | 0 | 15122 |
| Example 4 | 258 | 258 | 0 | 8056 |
| Example 5 | 124 | 25 | 80 | 40630 |
| Comparative Example 1 | 172 | 41 | 76 | 15137 |
| Comparative Example 2 | 182 | 182 | 0 | 35614 |
| Comparative Example 3 | 172 | 55 | 68 | 16620 |

Table 2 above shows the results of examining the removal rate, the polishing performance reduction rate (PRR), and defect occurrence for the polishing compositions of Examples 1 to 5 and Comparative Examples 1 to 3. The polishing compositions of Examples 1 to 4 exhibited a removal rate of 194 Å/min (the lowest) to 266 Å/min, and all exhibited a removal rate of 190 Å/min or more for the amorphous carbon layer, indicating that the polishing compositions exhibited a high removal rate of the amorphous carbon layer. In addition, it was confirmed that, even when the polishing process was performed after the polishing compositions were heated at a high temperature of 60° C. and cooled, the polishing compositions all exhibited a removal rate of 190 Å/min or more, and the polishing performance thereof was not reduced or a very small reduction in the polishing performance appeared, suggesting that the polishing compositions had excellent stability.

However, in the case of the polishing composition of Example 5, which contained the accelerator and the stabilizer within the weight ratio range of the present invention and in which the content ranges of the accelerator and stabilizer in the polishing composition were not included within the scope of the present invention, it was confirmed that the polishing composition exhibited a low removal rate, and showed a great reduction in the polishing performance as a result of measuring the removal rate after heating to the high temperature, indicating that the polishing composition had poor stability.

It was confirmed that Comparative Example 1 exhibited a removal rate of 172 Å/min before heating and 41 Å/min after heating, indicating that the value calculated by Equation 1 was 76%. In the case of Comparative Example 2, it was confirmed that the removal rate before heating was 182 Å/min, and the removal rate after heating was 182 Å/min, and thus there was no change in the removal rate, but the removal rate of the amorphous carbon layer was 190 Å/min or less, and 35,614 defects occurred. In the case of Comparative Example 3, it was confirmed that the removal rate before heating was 172 Å/min and the removal rate after heating was 55 Å/min, indicating that the value calculated by Equation 1 was 68%, which corresponds to a very large reduction in the polishing performance. In the case of the Comparative Examples, there was a large difference in the removal rate between before and after heating, or there was a problem associated with defect occurrence even though there was no difference in the removal rate.

Although preferred embodiments of the present invention have been described in detail above, the scope of the present invention is not limited thereto, and various modifications and improvements made by those skilled in the art without departing from the basic concept of the present invention as defined by the appended claims also fall within the scope of the present invention.

110: polishing pad
120: platen
130: semiconductor substrate
140: nozzle
150: polishing slurry
160: polishing head
170: conditioner

INDUSTRIAL APPLICABILITY

The present invention relates to a polishing composition for a semiconductor process, a method for preparing the polishing composition, and a method of fabricating a semiconductor device using the polishing composition.

The invention claimed is:

1. A polishing composition for a semiconductor process containing abrasive particles, an accelerator, and a stabilizer,
wherein the accelerator comprises cerium salts; and
the stabilizer is an amino acid
wherein the amino acid is selected from the group consisting of arginine, histidine, lysine, aspartic acid, glutamic acid, glutamine, cysteine, proline, asparagine, threonine, alanine, glycine, valine, leucine, isoleucine, and mixtures thereof,
wherein the polishing composition comprises 1 wt % to 2 wt % of the stabilizer, and
the accelerator and the stabilizer are contained at a weight ratio of 0.5:1 to 3:1,
wherein the polishing composition having a polishing performance reduction rate (PPR) of 0% to 60% as calculated by Equation 1 below:

$$PPR = \frac{A0 - A1}{AO} \times 100 \quad \text{[Equation 1]}$$

wherein
A0 is a removal rate measured after performing a polishing process on an amorphous carbon layer (ACL) having a thickness of 2,000 Å for 60 seconds using the polishing composition under the following polishing conditions: a polishing pressure of 2 psi, a carrier rotation speed of 87 rpm, a platen rotation speed of 93 rpm, and a feed flow rate of the polishing composition of 200 ml/min; and
A1 is a removal rate measured after performing the polishing process on the ACL for 60 seconds using the polishing composition under the polishing conditions after keeping the polishing composition at a temperature of 60° C. for 40 hours and cooling the polishing composition at 20 to 25° C.

2. The polishing composition of claim 1, wherein the accelerator further comprises one or more from the group consisting of anionic molecules, anionic polymers, hydroxyl acids, and amino acids.

3. The polishing composition of claim 1, wherein the abrasive particles are selected from the group consisting of metal oxide particles, organic particles, organic-inorganic composite particles, and mixtures thereof.

4. The polishing composition of claim 1, further comprising a surfactant and a pH adjusting agent.

5. A method for preparing the polishing composition for a semiconductor process of claim 1, the method comprising steps of:

a) preparing a polishing solution by mixing the stabilizer and the accelerator in a solvent;

b) adjusting a pH of the polishing solution to 2 to 5 by adding a pH adjusting agent to the polishing solution; and c) mixing a surfactant and the abrasive particles with the polishing solution having a pH of 2 to 5.

6. The method of claim 5, wherein step a) comprises:

preparing a mixed solution by mixing the stabilizer with the solvent; and preparing the polishing solution by mixing the mixed solution with the accelerator.

7. A method of fabricating a semiconductor, the method comprising steps of:

1) providing a polishing pad comprising a polishing layer;

2) supplying the polishing composition of claim 1 for a semiconductor process to the polishing pad; and 3) polishing a polishing target while allowing the polishing target and the polishing pad to rotate relative to each other so that a polishing-target surface of the polishing target comes into contact with a polishing surface of the polishing layer.

* * * * *